United States Patent [19]

Rothgordt et al.

[11] 4,062,014

[45] Dec. 6, 1977

[54] NATURAL BINARY TO LOGARITHMIC BINARY CONVERSION DEVICE WITH MEANS FOR RANGE SELECTION

[75] Inventors: Ulf Rothgordt, Norderstedt; Bernd Ehlers, Tornesch; Ernst Bunge, Hamburg; Herbert Piotrowski, Kaltenkirchen, all of Germany

[73] Assignee: U.S. Philips Corporation, New York, N.Y.

[21] Appl. No.: 653,922

[22] Filed: Jan. 30, 1976

[30] Foreign Application Priority Data

Feb. 8, 1975 Germany .............................. 2505388

[51] Int. Cl.² ............................................ H03K 13/24
[52] U.S. Cl. ............................. 340/347 DD; 235/310
[58] Field of Search ................ 340/347 DD; 235/154, 235/152

[56] References Cited

U.S. PATENT DOCUMENTS

| 3,610,901 | 10/1971 | Lynch .................................... 235/152 |
| 3,694,639 | 9/1972 | Deschenes ................... 340/347 DD |
| 3,875,344 | 4/1975 | Bogart .......................... 340/347 DD |

*Primary Examiner*—Charles D. Miller
*Attorney, Agent, or Firm*—Frank R. Trifari; Daniel R. McGlynn

[57] ABSTRACT

In practice it is often desirable to represent only a given, selectable dynamic range of a measuring signal, preferably in logarithmic form. This is achieved in accordance with the invention in that from the measured value in the form of a binary number only the positions corresponding to the desired dynamic range are selected for forming the base number, the weight of the most significant bits having the value "1" being converted into a binary number. The mantissa is derived from the following positions, i.e. independent of the selected dynamic range, so that even when the most significant bit is in the last position, a mantissa comprising the full number of positions is formed. The magnitude of the dynamic range is chosen by omitting the correspondingly more significant positions of the base number formed for the maximum range. The position of the dynamic range can be shifted in that the inputs of the circuits for forming the base number and the mantissa are shifted with respect to the lines supplying the individual positions of the measured value.

1 Claim, 6 Drawing Figures

| 1 | 2 | 3 | 4 |
|---|---|---|---|
| binary number $bn1......bn5$ | mantisse $bm1......bm5$ | correction decaded | number binary |
| 00000 | 00001 | 1 | 01 |
| 00001 | 00010 | 1 | 01 |
| 00010 | 00011 | 1 | 01 |
| 00011 | 00101 | 2 | 10 |
| 00100 | 00110 | 2 | 10 |
| 00101 | 00111 | 2 | 10 |
| 00110 | 01001 | 3 | 11 |
| 00111 | 01010 | 3 | 11 |
| 01000 | 01011 | 3 | 11 |
| 01001 | 01100 | 3 | 11 |
| 01010 | 01101 | 3 | 11 |
| 01011 | 01110 | 3 | 11 |
| 01100 | 01111 | 3 | 11 |
| 01101 | 10000 | 3 | 11 |
| 01110 | 10001 | 3 | 11 |
| 01111 | 10010 | 3 | 11 |
| 10000 | 10011 | 3 | 11 |
| 10001 | 10100 | 3 | 11 |
| 10010 | 10101 | 3 | 11 |
| 10011 | 10110 | 3 | 11 |
| 10100 | 10111 | 3 | 11 |
| 10101 | 11000 | 3 | 11 |
| 10110 | 11001 | 3 | 11 |
| 10111 | 11001 | 2 | 10 |
| 11000 | 11010 | 2 | 10 |
| 11001 | 11011 | 2 | 10 |
| 11010 | 11100 | 2 | 10 |
| 11011 | 11101 | 2 | 10 |
| 11100 | 11101 | 1 | 01 |
| 11101 | 11110 | 1 | 01 |
| 11110 | 11111 | 1 | 01 |
| 11111 | 11111 | 0 | 00 |

Fig.6

NATURAL BINARY TO LOGARITHMIC BINARY CONVERSION DEVICE WITH MEANS FOR RANGE SELECTION

The invention relates to a method of converting a measured value in the form of a binary number into an output binary number representing the binary logarithm, whereby, for the base number the most significant binary digit having the value "1" in the measured value to be converted is converted into a binary number, and also relates to devices for performing this method.

A method of this kind is described in German Offenlegungsschrift No. 2,312,128. Therein, the base number is determined from the complete measured value, and for the mantissa the binary digits following the most significant binary digit having the value "1" are added to the base number. For the sake of simplicity, the mantissa is limited to a given fixed number of positions.

In many practical applications, however, it is desirable to adapt the range of the quantity to be represented to the relevant circumstances, in that, in order to increase the resolution, only a given dynamic range of the measured value utilized the full accuracy of the output binary number representing the logarithm. This corresponds to the preselection of the dynamic range. For example, if the amount of the spectrum of an electrical or acoustic signal is to be represented, high resolution of the value of the amount in a given spectral range may necessitate the use of the complete scale (for example, the vertical deflection on the screen of an oscilloscope) available for an overall range of, for example, 12 dB, whilst in the case a survey of the complete spectrum the secondary lines of lower intensity should also appear.

The invention has for its object to provide a method of the logarithmic conversion of a measured value with selectable dynamic range. This object is achieved in accordance with the invention by following the steps described in the principal Claim. Therefore, so as to form the base number only the selected dynamic range is taken from the measured value and is considered as a complete binary number to be converted, whilst the formation of the mantissa is effected completely independent of the preselection of the dynamic ranges. Either the lower positions only, or the higher positions only or higher and lower positions can then be omitted from the measured value. A constant accuracy of the converted measured value is thus achieved, independent of the position of the measured value in the selected dynamic range.

A simple possibility of selecting the dynamic range to be converted consists in the conversion of a maximum range of the measured value or even the entire measured value in each case into a base number and, when a smaller dynamic range is selected, to omit the corresponding number of highest positions from the base number formed. The output binary signal thus comprises fewer positions, so that a corresponding number of additional mantissa positions can be taken into account, particularly when the number of positions of the mantissa was limited as usual by the limited number of positions of the output binary signal.

When a comparatively small dynamic range is chosen, it may occur that some measured values to be converted are larger or smaller than this range, so that they can no longer be correctly converted. On the other hand, at least the fact that the value is larger or smaller should be indicated as clearly as possible. Therefore, when the range is chosen so that at least one of the higher positions of the measured value is omitted, all digits in the output binary number are assigned the value "1" if at least one of the positions preceding the selected dynamic range has the binary digit "1", and all digits in the output binary number are assigned the value "0" when all positions of the measured value which correspond to or are higher than the selected dynamic range contain the binary digit "0". The exceeding of the dynamic range is thus formed as a limit, whilst the fact that the measured value is smaller than the selected dynamic range produces the zero point, which strictly speaking should not occur in a logarithmic representation. The accuracy of the representation of the measured values in the selected dynamic range can thus be substantially enhanced. A further improvement of the accuracy can be achieved by determining the mantissa as accurately as possible on the basis of the digits following the most significant binary digit having the value "1", by correcting the binary number formed by these following binary digits by a correction number which is dependent of the value of this binary number. The correction number is effectively determined in accordance with the exact value of the logarithm of the binary number which lies between the binary number formed by the following binary digits and the binary number which is larger by the smallest possible binary unit. The fact that the last binary digit considered is usually followed by further binary digits is thus taken into account, the said further binary digits thus being taken into account as an average.

In a device for performing the method in accordance with the invention, the input lines, carrying the individual digits of the complete measured value in parallel, are connected to the circuits for forming the base number and the mantissa via switches. When the number of inputs of these circuits is smaller than the number of lines for the measured value, a number of lines will not be covered for the conversion; the lines for the higher positions which of the measured value which are not included are connected to an indicator which determines whether in these positions a binary digit has the value "1", and if so, the binary digit "1" is applied to all positions of the output binary number. This switch governs the position of the selected dynamic range.

In order to determine the magnitude of the selected dynamic range, second switches are connected behind the outputs of the circuits for forming the characteristics and the mantissa; by means of these switches the highest digits can be omitted from the base number and a corresponding number of additional positions of the mantissa can be considered.

Further embodiments in accordance with the invention are given in the other claims.

Preferred embodiments in accordance with the invention will be described in detail hereinafter with reference to the drawing.

FIG. 6 shows a table illustrating the relationship between binary antilogarithm, exact mantissa and correction number.

Figure 1:
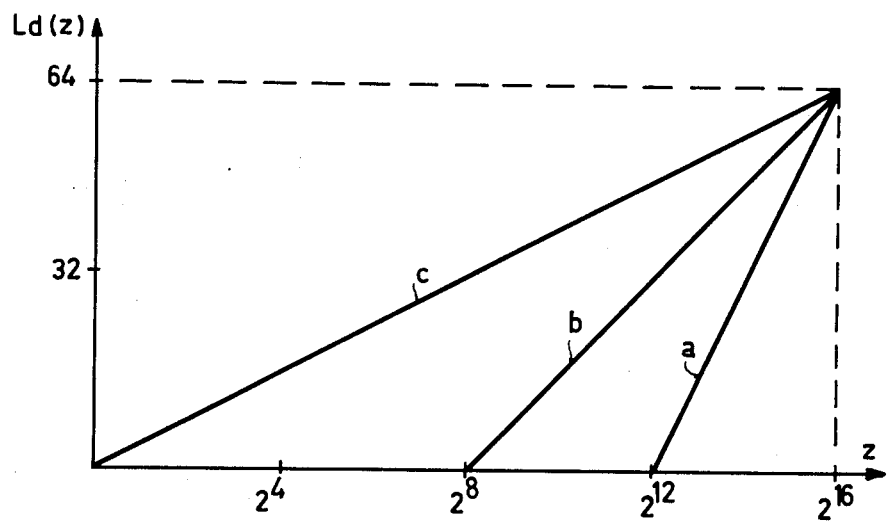
FIGS. 1 and 2 show diagrams to illustrate a dynamic range shift.
Figure 2:
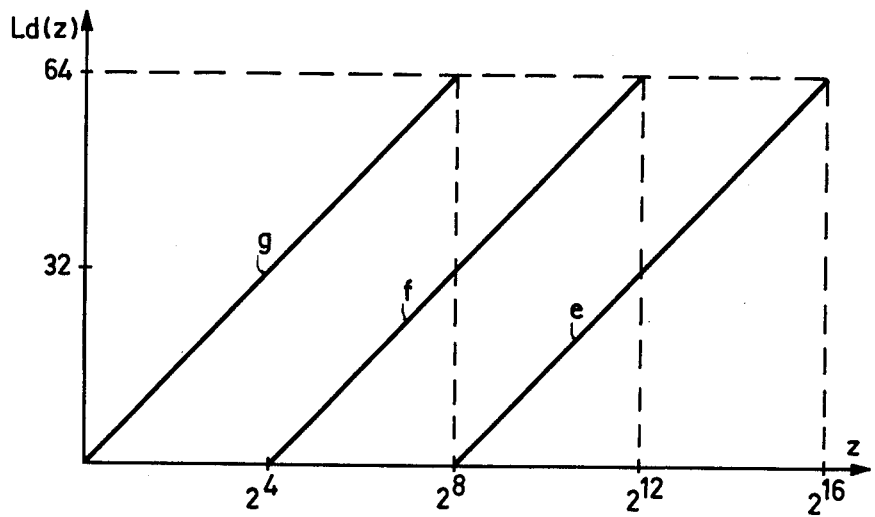

FIGS. 1 and 2 show the relationship between the binary number to be converted, i.e. the measured value $z$, and the output binary number $Ld(z)$ representing the logarithm. Because the axis $z$ is logarithmacally subdivided for the purpose of representation, a linear relationship is again obtained. FIG. 1 shows several dynamic ranges which differ as regards magnitude. In the case of the line $a$, conversion takes place only of measured values exceeding the value $2^{12}$, and the maximum output value is reached at measured values having the value $2^{16}$ already. As a result, only high measured values are represented to be substantially extended, whilst small measured values are completely suppressed.

In the case of line $b$, smaller measured values are included, i.e. those exceeding the measured value $2^8$. The extension of the measured values in the upper range is not so pronounced in this case, so that smaller measured values yet are included. The line $c$ illustrates the arrangement when all measured values from 0 to $2^{16}$ are covered. This is the normal conversion known thus far.

FIG. 2 shows the shifting of the position of the dynamic range. The line $e$ corresponds to the line $b$ of FIG. 1. When the inputs of the circuits for forming the base number and the mantissa over shifted over 4 positions with respect to the lines for the measured value, a conversion is obtained as denoted by the line $f$. All measured values below the value $2^4$ are then suppressed, whilst the maximum output value is already reached at measured values having the value $2^{12}$. Higher measured values then only produce the maximum output value. The line $g$ denotes the conversion after a further shift over four positions. Measured values as from the value zero are then already covered, whilst measured values in excess of the value $2^8$ already produce the maximum output value. Similarly, the line $a$ of FIG. 1 can also be shifted, each time a correspondingly smaller range of the measuring values then being covered, i.e. the extension or resolution is then even larger.

Figure 3:
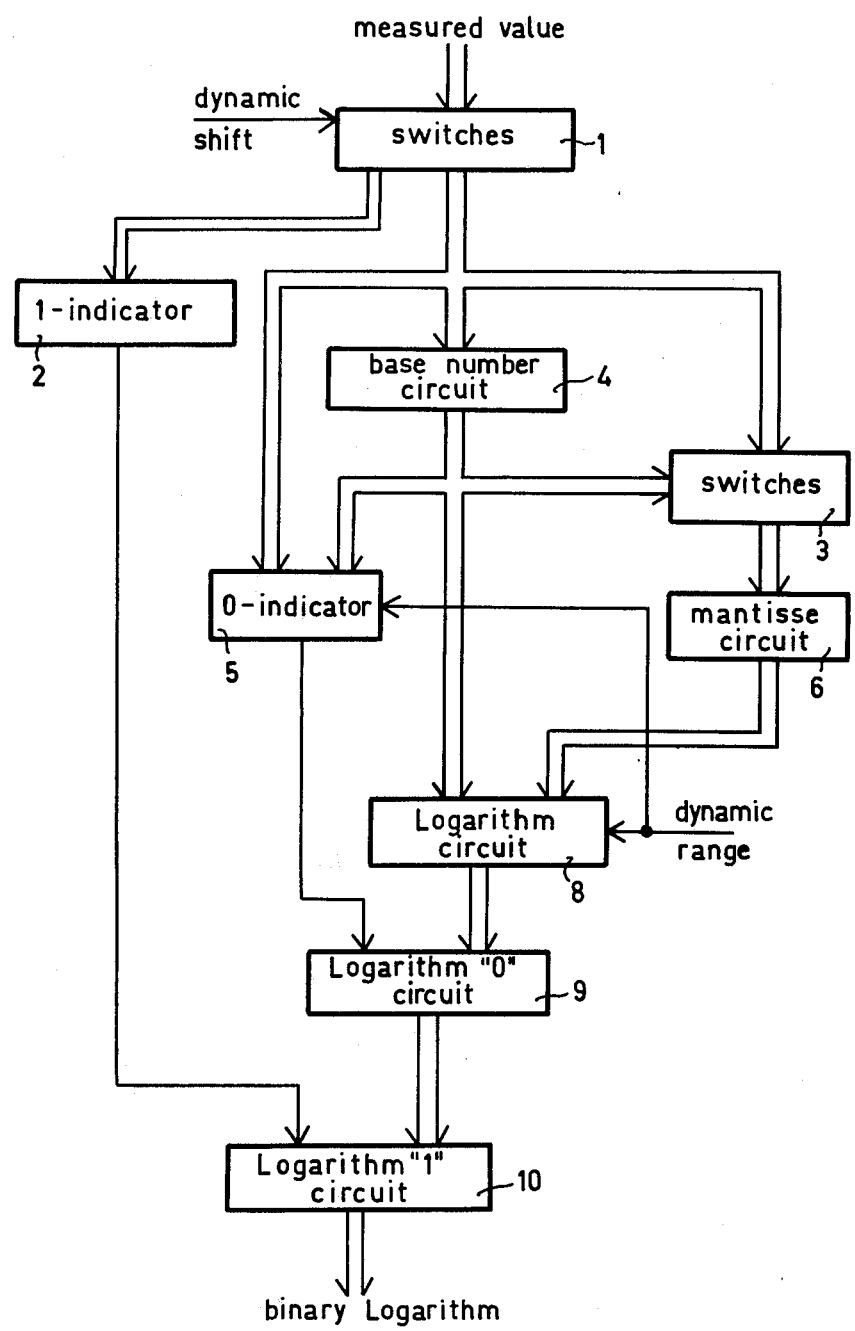
FIG. 3 shows a block diagram of the complete conversion device.

In the conversion device shown in FIG. 3, the measured value is first applied to the circuit 1 in which the position of the dynamic range, i.e. the dynamic shift, is adjusted. The shift is in accordance with the dynamic range shift shown in FIG. 2. The circuit 1 effectively comprises a row of switches, i.e. for each input line of the subsequent circuits 4 and 3, which are position-wise interconnected. The switches shift these inputs in parallel with respect to the positions of the applied binary measured value.

The positions beyond the selected dynamic range of the binary measured value are applied to a 1-indicator 2 which checks whether in these positions at least one binary digit having the value "1" is present. In the simplest case this indicator can also be realized by an OR-circuit. If a value "1" is detected, the value "1" is assigned to the binary digits of all positions in the output stage 10, regardless of the binary number in the selected dynamic range. The base number for the range of the measured value selected by the switch 1 is formed in the circuit 4, in that therein the most significant binary digit having the value "1" is determined, this most significant binary digit being converted into a binary number having a predetermined number of positions. This number of positions determines the maximum dynamic range of the measured value which can be converted. Using the characteristics, in the circuit 3 a selection takes place of the digits of the binary measured value from which the mantissa is formed, i.e. the positions following the most significant binary digit having the value 1. The circuit 3 can be constructed as a switch composed of electronic switches which select the corresponding binary digits.

These selected binary digits are subsequently corrected in the circuit 6 by a correction number which is determined by the value of the binary number present in this circuit, the mantissa thus being formed. The two binary numbers from the circuits 4 and 6, representing the base number and the mantissa, are combined in the circuit 8, so that the lowest position of the base number directly adjoins the highest position of the mantissa. These two combined binary numbers are then applied, via switches in the circuit 8, to the lines for the output binary number, the switches being operated in parallel by the setting of the magnitude of the dynamic range, so that the output lines of the circuit 8 are shifted parallel to the input lines thereof. As a result, the magnitude of the dynamic range is also adjusted as shown in FIG. 1. For example, if the magnitude of the dynamic range is to be switched over from a range of $2^8$ ($2^8 - 2^{16}$) to a range of $2^4$ ($2^{12} - 2^{16}$), the base number can still be determined for a value range of $2^8$ values; in this case only the first position is omitted, as will be readily understood.

In the 0-indicator it is checked whether the base number has the value "0", i.e. the positions corresponding to the selected dynamic range, and simultaneously whether the lowest position of the measured value in this range also has the digit "0". In this case the output binary number must also have the value "0"; this is achieved in the circuit 9 under the control of the 0-indicator 5. The selected dynamic range is applied to the 0-indicator 5 via the additional line for the adjustment of the magnitude of the dynamic range.

Figure 4:
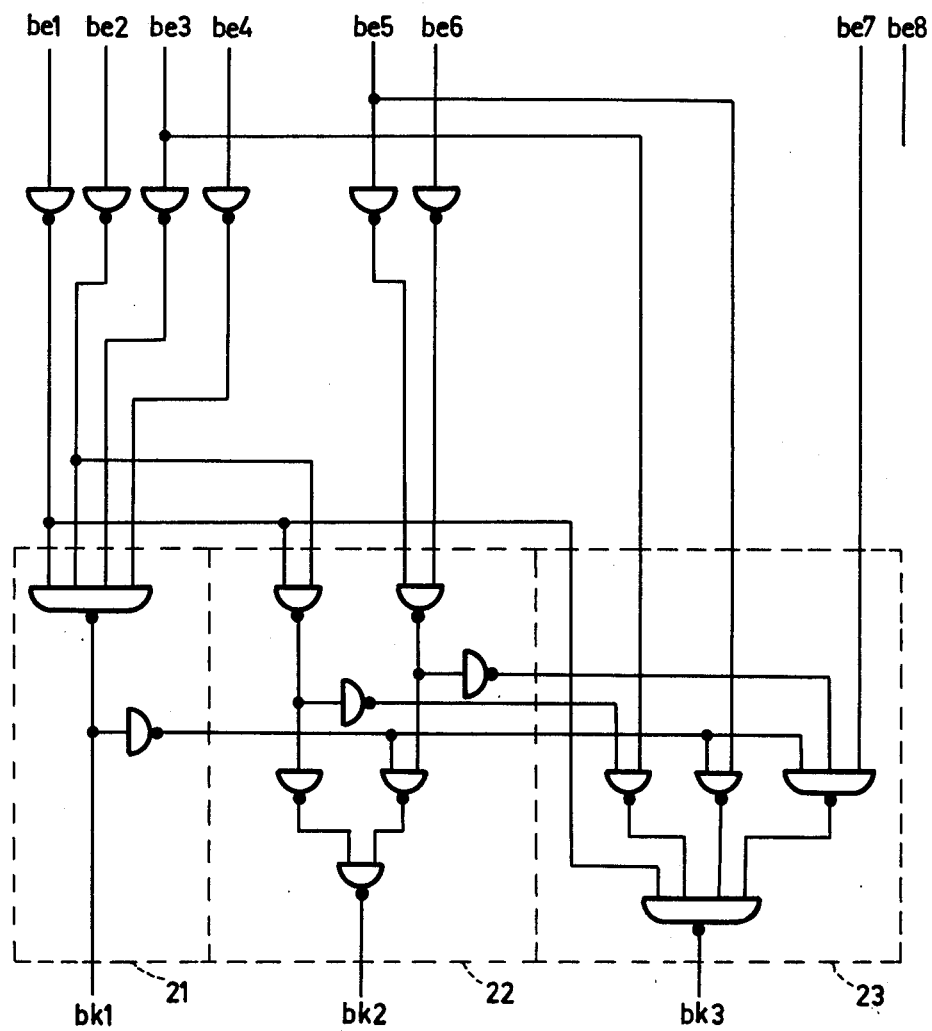
FIG. 4 shows a logic circuit diagram for forming the characteristic.

FIG. 4 shows a circuit arrangement for forming the base number for a binary number, comprising a maximum of 8 positions. The lines for the individual binary digits of measured value to be converted in accordance with the selected dynamic range are connected to the inputs $be1-be8$, the first input receiving the highest position. The base number of an eight-position binary number comprises at the most three positions which are formed on the outputs $bk1-bk3$, the former output again producing the most significant position. Each output is preceded by a logic network 21, 22, 23, respectively, which decodes the combinations of the input signals (binary numbers) at which the relevant output (position of the base number) must form a signal. For the first position of the base number, i.e. on the output $bk1$, a signal must be produced when the value "1" is present in at least one of the four most significant positions of the binary number to be converted. This is effected by the NAND-gate in the logic network 21 which receives the inverted signals of the four most significant positions and which thus realizes an OR-function. Similarly, the logic networks 22 and 23 produce the signals at which each time the effect of a "1" in one of the less significant positions of the previous networks is inhibited if a higher position contains a "1". The least significant position, i.e. the input $be8$, has no effect on the output signal, so that the base number has a "0" in all three positions if a signal is present only on this input; this is in accordance with what has been defined.

Figure 5:
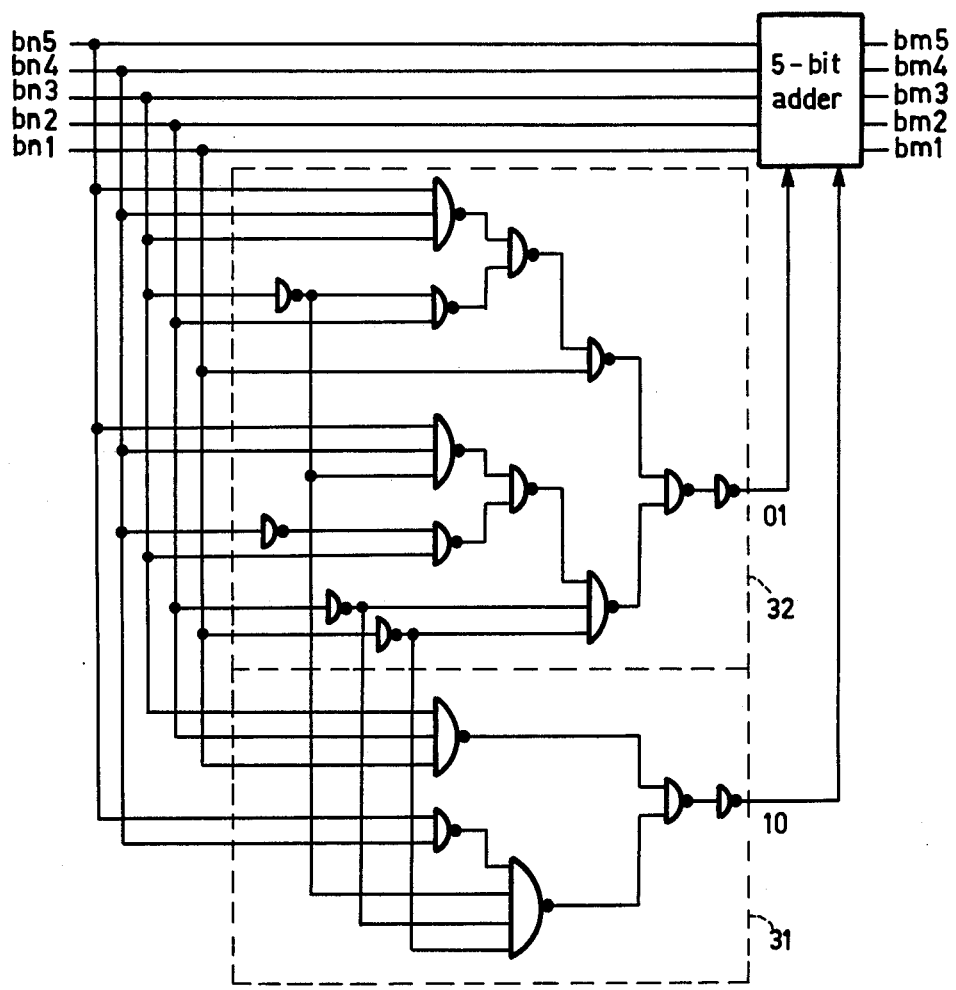
FIG. 5 shows a logic circuit diagram for forming the mantissa.

FIG. 5 shows a circuit arrangement for deriving the exact mantissa from the corresponding positions of the binary number. The individual positions of the binary number, are applied to the inputs $bn1-bn5$, the input $bn1$ receiving the comparatively most significant position of the binary number. In this example it is assumed that the mantissa must comprise only 5 positions, so that only 5 positions of the binary number to be converted can be treated. However, if the binary number to be converted comprises more positions, for example, 8 positions, for which the circuit arrangement of FIG. 4 for forming the base number has been designed, and the most significant position has the value "1", the mantissa should be derived from the 7 subsequent positions. In this case, however, the last two binary digits are not taken into account for the conversion. However, if the value "1" occurs only at an essentially less significant position of the binary number to be converted, only less than 5 positions will be available for forming the mantissa from the positions of the measured value in accordance with the selected dynamic range. In that case the next less significant positions of the measured value, no longer belonging to the selected dynamic range, are used, so that the mantissa always comprises five positions. In the case of the maximum magnitude of the selected dynamic range of $2^8$ values, the base number comprises 3 positions, as has already been described with reference to FIG. 4, so that for a predetermined number of 6 positions of the output binary number only 3 positions of the mantissa formed can be taken into account. This is effected, as has also been described already, by means of switches in the circuit 8 of FIG. 3. However, if the magnitude of the selected dynamic range amounts to only $2^4$ values, the most significant position of the base number is omitted by the switches and instead an additional position of the mantissa is considered. If the magnitude of the selected dynamic range is even smaller, the base number ultimately comprises only one position, so that all 5 positions of the mantissa formed can be taken into account for the 6-position output binary number. Very simple switching over of the dynamic range is thus achieved; the output binary number then comprises 6 positions in all cases.

The inputs $bn1 - bn5$ of the circuit arrangement for forming the mantissa are connected to an adder 33 which can add 5 bits in parallel, because all 5 positions can also be changed by carries during the correction. The second input of the adder, whose value is to be added to the value of the first inputs, receives the correction binary numbers which in this case comprises only two positions and which are formed by the logic networks 31 and 32, respectively.

The relationship between antilogarithm, correction number and mantissa thus formed is shown in the table of FIG. 6. In the case of the smallest binary number, i.e. the number 0, the correction number already has the decimal value 1, and hence the mantissa also has this value, which means that the mantissa never becomes 0. The correction number becomes 0 only in the case of the largest binary number, so that the binary number and the mantissa then correspond. Therebetween, the correction number has the highest decimal value 3 or binary "11".

The two logic networks 31 and 32 form, in accordance with this table, the two positions of the correction number by means of logic gates similar to the formation of the base number digits in FIG. 4, details of the logic networks, of course, being different because of the different assignment. The construction of these networks follows almost directly from the table of FIG. 6. When the two networks simultaneously carry an output signal, a binary correction of $01 + 10 = 11$ is performed.

The number of positions used herein for the base number, the mantissa and the output binary number have been selected merely by way of example and within the scope of the invention they can be changed at random for other applications.

What is claimed is:

1. A device comprising
   an input for supplying a binary number to be converted into a binary logarithm;
   switch means having a control input for shifting the input number in parallel a predetermined number of bit positions, and having a binary valued output;
   a 1-indicator connected to the output of said switch means for producing a signal if at least one bit on said output of said switch means has a "1" value;
   a base number circuit connected to the output of said switch means for forming the base number of said binary number, and having an output;
   a mantissa circuit connected to the output of said switch means for forming the mantissa of said binary number, and having an output;
   a 0-indicator connected to the output of said switch means for producing a signal if all bits of said base number have a "0"-value, and the bit of the least significant position of the dynamic range also has the value "0";
   a logarithm circuit, connected to the output of said base number circuit and said mantissa circuit for selecting the magnitude of the dynamic range, the output of the least significant position of the base circuit directly adjoining the output for the most significant position of the mantissa circuit, and having an output representing the binary logarithm;
   a logarithm 0-circuit connected to the output of said logarithm circuit and said 0-indicator for producing a 0-value binary number output when the 0-indicator indicates that the base number has the value "0"; and
   a logarithm 1-circuit connected to the output of said 0-circuit and said 1-indicator for producing a binary number with the value "1" in each bit position if the 1-indicator indicates a 1-value.

* * * * *